United States Patent
Sakai et al.

(10) Patent No.: US 12,112,957 B2
(45) Date of Patent: Oct. 8, 2024

(54) RELEASE FILM AND METHOD OF MANUFACTURING RELEASE FILM

(71) Applicant: KOBAYASHI & CO., LTD., Tokyo (JP)

(72) Inventors: Keisuke Sakai, Matsudo (JP); Norifumi Iwawaki, Matsudo (JP); Nanae Tanaka, Matsudo (JP); Satoshi Hiramatsu, Matsudo (JP); Akane Kawafuchi, Matsudo (JP)

(73) Assignee: KOBAYASHI & CO., LTD., Tokyo (JP)

( * ) Notice: Subject to any disclaimer, the term of this patent is extended or adjusted under 35 U.S.C. 154(b) by 391 days.

(21) Appl. No.: 17/252,136

(22) PCT Filed: Apr. 8, 2019

(86) PCT No.: PCT/JP2019/015352
§ 371 (c)(1),
(2) Date: Dec. 14, 2020

(87) PCT Pub. No.: WO2019/244447
PCT Pub. Date: Dec. 26, 2019

(65) Prior Publication Data
US 2021/0257228 A1    Aug. 19, 2021

(30) Foreign Application Priority Data

Jun. 22, 2018 (JP) ................................ 2018-119269

(51) Int. Cl.
*B32B 3/10* (2006.01)
*B29C 33/68* (2006.01)
(Continued)

(52) U.S. Cl.
CPC ............ *H01L 21/566* (2013.01); *B29C 33/68* (2013.01); *H01L 23/293* (2013.01)

(58) Field of Classification Search
None
See application file for complete search history.

(56) References Cited

U.S. PATENT DOCUMENTS

2016/0368175 A1    12/2016    Kasai et al. ............ B29C 33/68
2016/0368176 A1*  12/2016    Kasai ........................ B32B 7/06

FOREIGN PATENT DOCUMENTS

| CN | 104112693 A | 10/2014 |
| CN | 107225831 A | 10/2017 |

(Continued)

OTHER PUBLICATIONS

Machine translation of JP-2015074201-A (Year: 2015).*
(Continued)

*Primary Examiner* — Christopher M Polley
(74) *Attorney, Agent, or Firm* — Stein IP, LLC

(57) ABSTRACT

To provide a release film not to contaminate a mold or a molded article. The present invention provides a release film comprising a base layer formed of an easily moldable polyethylene terephthalate resin and surface layers laminated on two faces of the base layer and formed of a fluororesin. The present invention also provides a method of manufacturing a release film. The method comprises an applying step of applying a fluororesin composition onto two faces of a base layer formed of an easily moldable polyethylene terephthalate resin and, after the applying step, a curing step of curing the fluororesin composition. By molding with the release film, contamination of a mold or a molded article is prevented. The release film can be used in molding multiple times.

11 Claims, 6 Drawing Sheets

(51) Int. Cl.
  *H01L 21/56*   (2006.01)
  *H01L 23/29*   (2006.01)

(56) References Cited

FOREIGN PATENT DOCUMENTS

| CN | 109153155 A | | 1/2019 |
|---|---|---|---|
| EP | 1612021 A1 | | 1/2006 |
| JP | 2001-129940 A | | 5/2001 |
| JP | 2003-261702 A | | 9/2003 |
| JP | 2006-049850 A | | 2/2006 |
| JP | 2007-237714 A | | 9/2007 |
| JP | 2013-141793 A | | 7/2013 |
| JP | 2015074201 A | * | 4/2015 |
| JP | 2017-100397 A | | 6/2017 |
| WO | WO 2008/020543 A1 | | 2/2008 |
| WO | WO 2015/133631 A1 | | 9/2015 |
| WO | WO 2015/133634 A1 | | 9/2015 |
| WO | WO 2018/079596 A1 | | 5/2018 |

OTHER PUBLICATIONS

International Search Report dated May 28, 2019, issued to International Application No. PCT/JP2019/015352.

Japanese Notice of Reasons for Rejection dated May 16, 2019, issued to corresponding Japanese Application No. 2019-519350.

Singaporean Search Report and Written Opinion dated Oct. 11, 2021, issued by the Intellectual Property Office of Singapore in corresponding application SG 11202012852T.

Chinese Office Action dated Apr. 17, 2023, issued by the China National Intellectual Property Administration in corresponding application CN 201980040956.5.

Substantive Examination Report (Restriction Requirement) of the corresponding Philippines patent application was served on Mar. 5, 2024.

Philippines Office Action mailed May 9, 2024, issued to corresponding Philippines Patent Application No. 01/2020/552134.

* cited by examiner

0 PIECE

RELEASE FILM AND METHOD OF MANUFACTURING RELEASE FILM

CROSS-REFERENCE TO RELATED APPLICATIONS

This application is a national stage of International Application No. PCT/JP2019/015352, filed Apr. 8, 2019, which claims the benefit of Japanese Application No. 2018-119269, filed Jun. 22, 2018, in the Japanese Patent Office, the disclosures of which are incorporated herein by reference.

TECHNICAL FIELD

The present invention relates to a release film and a method of manufacturing the film, and more specifically relates to a release film used for transfer molding or compression molding and a method of manufacturing the film.

BACKGROUND ART

In order to seal a semiconductor with a resin, a molding technique such as transfer molding and compression molding is used. In the molding technique, a release film is often used to facilitate the release of a molded article from a mold after a resin is cured in the mold, and various release films have been developed.

For example, Patent Document 1 discloses a release film that includes a coated film including a composition containing a fluorine resin (A) having a functional group X and a release component (B) and includes a layer including a non-fluorinated polymer.

Patent Document 2 discloses a gas-barrier release film for semiconductor resin molding. The release film at least includes a release layer (I) having excellent mold release properties and a plastic support layer (II) supporting the release layer. The plastic support layer (II) has a strength of 1 MPa to 50 MPa at 200% elongation at 170° C., and the release film has a xylene gas permeability of $5 \times 10^{-15}$ (kmol·m/(s·m²·kPa)) at 170° C.

CITATION LIST

Patent Documents

Patent Document 1: JP-A No. 2015-74201
Patent Document 2: WO2008/020543

SUMMARY OF THE INVENTION

Technical Problem

The release film is used to facilitate the release of a molded article from a mold, as described above. It is desirable that the release film be easily released from a molded article after resin curing.

When a release film is subjected to a high temperature in a mold, a component contained in the release film may move to the surface of the release film, and the component that moves to the surface may contaminate the mold or a molded article. When such contamination occurs, the component is required to be removed from a mold or a molded article. In addition, the component is often difficult to remove. Hence, it is desirable that no contamination of a mold or a molded article with the component occur.

A release film not only usable in molding once but also repeatedly usable in molding multiple times can reduce molding costs. In order to repeatedly use a release film in molding multiple times, the release film is required to maintain its properties through multiple molding operations.

In view of the above circumstances, the present invention is intended to provide a release film that does not contaminate a mold or a molded article. The present invention is also intended to provide a release film that does not contaminate a mold or a molded article and can be repeatedly used in multiple molding processes.

Solution to Problem

The inventors of the present invention have found that a release film having a specific configuration has excellent mold release properties and low contamination properties. The inventors of the present invention have further found that the release film can be used in molding multiple times.

The present invention provides a release film comprising a base layer formed of an easily moldable polyethylene terephthalate resin and surface layers that are laminated on two faces of the base layer and formed of a fluororesin.

The easily moldable polyethylene terephthalate resin may have a glass transition temperature of 60° C. to 95° C.

The release film may have a tensile breaking strength of 40 MPa to 200 MPa as determined at 175° C. in accordance with JIS K7127, and the release film may have a tensile elongation at break of 200% to 500% as determined at 175° C. in accordance with JIS K7127.

The release film may have an oxygen gas permeability of 5,000 to 50,000 cc/m²·24 hr·atm as determined at 175° C. in accordance with JIS K7126-1.

The base layer may have a tensile breaking strength of 40 MPa to 200 MPa as determined at 175° C. in accordance with JIS K7127.

The base layer may have a tensile elongation at break of 200% to 500% as determined at 175° C. in accordance with JIS K7127.

The fluororesin that forms the surface layer on at least one face of the base layer may comprise an isocyanate curing agent.

The fluororesin that forms the surface layer on at least one face of the base layer may comprise particles having an average particle size of 1 μm to 10 μm determined by laser diffraction particle size analysis.

The fluororesin that forms the surface layer may comprise a tetrafluoroethylene resin.

The release film may be used for transfer molding or compression molding.

The release film may be used for molding two or more times.

The present technique also provides a method of manufacturing a release film. The method comprises an applying step of applying a fluororesin composition onto two faces of a base layer formed of an easily moldable polyethylene terephthalate resin and, after the applying step, a curing step of curing the fluororesin composition.

Advantageous Effects of Invention

According to the present invention, a release film having excellent mold release properties and low contamination properties is provided. The release film of the present invention can be repeatedly used for molding multiple times.

The effect of the invention is not necessarily limited to that described in this paragraph and may be any of the effect described in the present description.

DESCRIPTION OF EMBODIMENTS

Embodiments for carrying out the present invention will now be described in detail. Embodiments described below are merely examples of typical embodiments of the present invention, and the present invention is not limited to these embodiments.

1. Release Film

Figure 1:
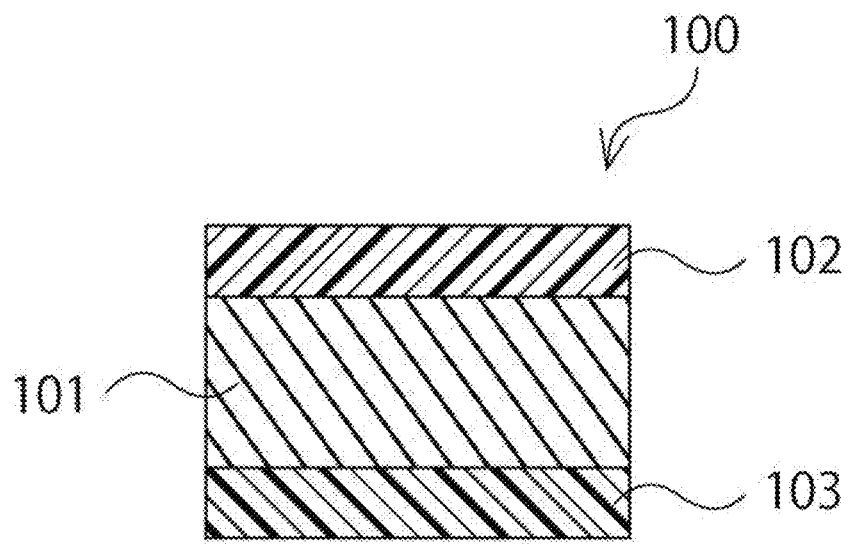
FIG. 1 is a view showing an example structure of a release film of the present invention.

A release film (mold-release film) of the present invention comprises a base layer formed of an easily moldable polyethylene terephthalate resin and comprises surface layers that are laminated on two faces of the base layer and are formed of a fluororesin. An example structure of the release film of the present invention is shown in FIG. 1. As shown in FIG. 1, a release film 100 of the present invention comprises a base layer 101 and surface layers 102 and 103 laminated on both faces of the base layer. The base layer 101 is formed of an easily moldable polyethylene terephthalate resin. The two surface layers 102 and 103 are formed of a fluororesin. The two surface layers 102 and 103 may be formed of the same fluororesin or may be formed of different fluororesins.

The release film of the present invention comprises the base layer and the surface layers formed on both faces of the base layer, and thus has excellent mold release properties and low contamination properties on a mold (metal mold) and/or a molded article in molding. In addition, the release film of the present invention can be used for carrying out a molding process multiple times. Effects achieved by the release film of the present invention will now be described in more detail.

A polyethylene terephthalate resin contains oligomers produced in production thereof and having low polymerization degrees. When a release film comprising a layer formed of such a polyethylene terephthalate resin is used to perform molding, the oligomer may move to the surface of the release film and may contaminate a molded article and/or the surface of a mold. The contamination may be caused even when, for example, a fluorine resin layer is laminated on the surface of the polyethylene terephthalate resin layer. This is thought to be because the oligomer passes through the fluorine resin layer. The contamination is likely to be caused particularly when a single release film is used in carrying out a molding process multiple times. This is supposed to be because application of heat to the polyethylene terephthalate resin during molding causes the oligomer to move from the inside of the resin to the surface.

The release film of the present invention has a configuration in which a surface layer formed of a fluororesin is laminated on each face of a base layer formed of an easily moldable polyethylene terephthalate resin. The easily moldable polyethylene terephthalate resin also contains the oligomer, but by adopting the above configuration, the contamination of a molded article and/or a mold by the oligomer is suppressed or prevented. Moreover, the release film of the present invention maintains the low contamination properties through multiple molding operations.

A typical release film is replaced with a fresh film every molding operation. This is because when a release film once used in a molding operation is used in another molding operation, the release film is highly probably broken. Breaking a release film is fatal to molding and can result in an abnormal shape of a molded article or can result in adhesion between a mold and a molded article, for example.

The release film according to the present invention is unlikely to break and maintains its mold release properties and low contamination properties even when used for molding multiple times. Hence, the release film according to the present invention can be used for molding multiple times, and this reduces molding costs.

The release film of the present invention will be described in more detail hereinafter.

[Base Layer]

The base layer included in the release film of the present invention is formed of an easily moldable polyethylene terephthalate resin. The easily moldable polyethylene terephthalate resin (also referred to as easily moldable PET resin) is a term used for referring to a PET resin having higher moldability than that of a conventional polyethylene terephthalate resin. The base layer formed of the easily moldable polyethylene terephthalate resin particularly contributes to making the release film of the present invention have low contamination properties.

The glass transition temperature of the easily moldable polyethylene terephthalate resin may preferably be 60° C. to 95° C. and more preferably 65° C. to 90° C. The easily moldable polyethylene terephthalate resin composition having a glass transition temperature within the above numerical range contributes to making the release film of the present invention usable in molding multiple times.

Conventional polyethylene terephthalates generally have a glass transition temperature of 100° C. or higher. The glass transition temperature of the easily moldable polyethylene terephthalate resin composition used in the present invention is lower than the glass transition temperature of a conventional polyethylene terephthalate.

The glass transition temperature is determined by differential thermal analysis (DTA).

The easily moldable polyethylene terephthalate resin may be a polyethylene terephthalate copolymer resin, for example. The polyethylene terephthalate copolymer may be produced, for example, by reaction of terephthalic acid, ethylene glycol, and a copolymer component or by mixing and melting a polymer as a copolymer component and polyethylene terephthalate and then performing distribution reaction.

The copolymer component may be an acid component or may be an alcohol component, for example. Examples of the acid component include aromatic dibasic acids (such as isophthalic acid, phthalic acid, and naphthalenedicarboxylic acid), aliphatic dicarboxylic acids (such as adipic acid, azelaic acid, sebacic acid, and decanedicarboxylic acid), and alicyclic dicarboxylic acids (such as cyclohexanedicarboxylic acid). Examples of the alcohol component include aliphatic diols (such as butanediol, hexanediol, neopentyl glycol, and hexanediol) and alicyclic diols (such as cyclohexanedimethanol). As the copolymer component, these compounds may be used singly or in combination of two or more of them. The acid component may specifically be isophthalic acid and/or sebacic acid.

As the base layer formed of the easily moldable polyethylene terephthalate resin used in the present invention, a commercially available product may be used. For example, Teleflex (trademark) FT, Teleflex (trademark) FT3, and Teleflex (trademark) FW2 (each manufactured by Teijin Film Solutions Ltd.) may be used as the base layer. As the base layer, EMBLET CTK-38 (manufactured by Unitika Ltd.) may also be used.

The base layer formed of the easily moldable polyethylene terephthalate resin may be produced by a method described, for example, in JP-A No. Hei-2-305827, JP-A No. Hei-3-86729, or JP-A No. Hei-3-110124. According to a preferred embodiment of the present invention, the base layer may be produced by biaxial stretching of an easily moldable polyethylene terephthalate resin so as to preferably have a plane orientation coefficient of 0.06 to 0.16, more preferably 0.07 to 0.15, as described in any of the above published documents.

The tensile breaking strength of the base layer, as determined at 175° C. in accordance with JIS K7127, may preferably be 40 MPa to 200 MPa, more preferably 40 MPa to 120 MPa, even more preferably 40 MPa to 110 MPa, and particularly preferably 45 MPa to 100 MPa.

The tensile elongation at break of the base layer, as determined at 175° C. in accordance with JIS K7127, may preferably be 200% to 500%, more preferably 250% to 450%, and even more preferably 300% to 400%.

The easily moldable polyethylene terephthalate resin that forms the base layer has higher extensibility than a conventional PET resin. Hence, the base layer can have a tensile breaking strength and/or a tensile elongation at break within the above numerical ranges, for example. The base layer having a tensile breaking strength and/or a tensile elongation at break within the above numerical ranges contributes to making the release film of the present invention usable in molding multiple times.

The thickness of the base layer may, for example, be 10 μm to 80 μm, preferably 15 μm to 75 μm, and more preferably 20 μm to 70 μm. The thickness contributes to making the release film of the present invention usable in molding multiple times.

[Surface Layer]

The surface layer included in the release film of the present invention is formed of a fluororesin. According to a preferred embodiment of the present invention, the fluororesin contains no chlorine. Containing no chlorine improves the durability and/or the antifouling properties of the layer. The fluororesin may, for example, be a cured product of a fluororesin composition containing a reactive functional group-containing fluoropolymer and a curing agent.

The fluororesin preferably contains a tetrafluoroethylene resin and more preferably contains a tetrafluoroethylene resin as a main component. In the present description, the tetrafluoroethylene resin is a component produced by curing reaction of a reactive functional group-containing tetrafluoroethylene polymer described below with a curing agent. A tetrafluoroethylene resin being a main component means that the fluororesin is composed of a tetrafluoroethylene resin or the content of a tetrafluoroethylene resin is the highest among the components of the fluororesin. For example, the content of a tetrafluoroethylene resin in the fluororesin may, for example, be 70% by mass or more, preferably 75% by mass or more, more preferably 80% by mass or more, and particularly preferably 85% by mass or more, relative to the total mass of the fluororesin. The content may, for example, be 99% by mass or less, particularly 98% by mass or less, and more particularly 97% by mass or less, relative to the total mass of the fluororesin.

The reactive functional group-containing fluoropolymer contained in the fluororesin composition may be a fluoropolymer that is curable by the curing agent. The reactive functional group and the curing agent may appropriately be selected by a person skilled in the art.

The reactive functional group may, for example, be a hydroxy group, a carboxyl group, the group represented by —COOCO—, an amino group, or a silyl group and is preferably a hydroxy group. Such a group allows a reaction for giving the cured product to satisfactory proceed.

Of these reactive functional groups, a hydroxy group is particularly suitable to the reaction for giving the cured product. In other words, the reactive functional group-containing fluoropolymer may preferably be a hydroxy group-containing fluoropolymer and more preferably a hydroxy group-containing tetrafluoroethylene polymer.

The fluorine-containing unit of the reactive functional group-containing fluoropolymer is preferably a fluorine-containing unit based on a perfluoroolefin. The fluorine-containing unit based on the perfluoroolefin may more preferably be based on one, two, or three selected from tetrafluoroethylene (tetrafluoroethylene, also referred to as "TFE" in the present description), hexafluoropropylene (HFP), and perfluoro(alkyl vinyl ethers) (PAVEs). Preferably, of the fluorine-containing units based on the perfluoroolefin, the amount of a fluorine-containing unit based on TFE is the largest.

The hydroxy value of the reactive functional group-containing fluoropolymer (particularly the hydroxy value of the hydroxy group-containing fluoropolymer) may preferably be 10 mg KOH/g to 300 mg KOH/g, more preferably 10 mg KOH/g to 200 mg KOH/g, and even more preferably 10 mg KOH/g to 150 mg KOH/g. The reactive functional group-containing fluoropolymer having a hydroxy value not less than the lower limit of the above numerical range may make the resin composition have good curing properties. The reactive functional group-containing fluoropolymer having a hydroxy value not more than the upper limit of the above numerical range may contribute to making the resin composition give a cured product suitable for multiple molding operations. The hydroxy value is determined by a method in accordance with JIS K 0070.

The acid value of the reactive functional group-containing fluoropolymer (particularly the acid value of the hydroxy group-containing fluoropolymer) may preferably be 0.5 mg KOH/g to 100 mg KOH/g and more preferably 0.5 mg KOH/g to 50 mg KOH/g. The reactive functional group-containing fluoropolymer having an acid value not less than the lower limit of the above numerical range may make the resin composition have good curing properties. The reactive functional group-containing fluoropolymer having an acid value not more than the upper limit of the above numerical range may contribute to making the resin composition give a cured product suitable for multiple molding operations.

The reactive functional group of the reactive functional group-containing fluoropolymer may be introduced into the fluoropolymer by copolymerization of a monomer having the reactive functional group with a fluorine-containing monomer (particularly the above perfluoroolefin). In other words, the reactive functional group-containing fluoropolymer may contain a polymer unit based on a reactive functional group-containing monomer and a polymer unit based on a fluorine-containing monomer (particularly the above perfluoroolefin).

When the reactive functional group is a hydroxy group, the monomer having the reactive functional group may preferably be a hydroxy group-containing vinyl ether or a hydroxy group-containing allyl ether. Examples of the hydroxy group-containing vinyl ether include 2-hydroxyethyl vinyl ether, 3-hydroxypropyl vinyl ether, 2-hydroxypropyl vinyl ether, 2-hydroxy-2-methylpropyl vinyl ether, 4-hydroxybutyl vinyl ether, 4-hydroxy-2-methylbutyl vinyl ether, 5-hydroxypentyl vinyl ether, and 6-hydroxyhexyl vinyl ether, and examples of the hydroxy group-containing hydroxy group-containing allyl ether include 2-hydroxyethyl allyl ether, 4-hydroxybutyl allyl ether, and glycerol monoallyl ether. Alternatively, the monomer having the reactive functional group may, for example, be a hydroxyalkyl ester of (meth)acrylic acid such as 2-hydroxyethyl acrylate and 2-hydroxyethyl methacrylate. As the monomer having the reactive functional group, these compounds may be used singly or in combination of two or more of them. When the reactive functional group is a hydroxy group, the monomer having the reactive functional group may more preferably be a hydroxy group-containing vinyl ether and specifically preferably 4-hydroxybutyl vinyl ether and/or 2-hydroxyethyl vinyl ether from the viewpoint of curing properties of the resin composition.

When the reactive functional group is a carboxyl group, the monomer having the reactive functional group may preferably be an unsaturated carboxylic acid, an ester of an unsaturated carboxylic acid, or an acid anhydride of an unsaturated carboxylic acid.

When the reactive functional group is an amino group, the monomer having the reactive functional group may, for example, be an amino vinyl ether or allylamine.

When the reactive functional group is a silyl group, the monomer having the reactive functional group may preferably be a silicone vinyl monomer.

The fluorine-containing monomer is preferably a perfluoroolefin. Examples of the perfluoroolefin include tetrafluoroethylene (TFE), hexafluoropropylene (HFP), and perfluoro(alkyl vinyl ethers) (PAVEs). Preferably, the fluorine-containing monomer comprises TFE.

Preferably, the reactive functional group-containing fluoropolymer may contain, in addition to the polymer unit based on a reactive functional group-containing monomer and the polymer unit based on a fluorine-containing monomer, a polymer unit based on a fluorine-free vinyl monomer. The fluorine-free vinyl monomer may, for example, be a single monomer or a combination of two or more monomers selected from vinyl carboxylates, alkyl vinyl ethers, and non-fluorinated olefins.

Examples of the vinyl carboxylate include vinyl acetate, vinyl propionate, vinyl butyrate, vinyl isobutyrate, vinyl pivalate, vinyl caproate, vinyl versatate, vinyl laurate, vinyl stearate, vinyl cyclohexylcarboxylate, vinyl benzoate, and vinyl para-t-butylbenzoate.

Examples of the alkyl vinyl ether include methyl vinyl ether, ethyl vinyl ether, butyl vinyl ether, and cyclohexyl vinyl ether.

Examples of the non-fluorinated olefin include ethylene, propylene, n-butene, and isobutene.

The reactive functional group-containing fluoropolymer may contain, in addition to the polymer unit based on a reactive functional group-containing monomer and the polymer unit based on a fluorine-containing monomer as a perfluoroolefin, a polymer unit based on a fluoromonomer other than the perfluoroolefin, such as vinylidene fluoride (VdF), chlorotrifluoroethylene (CTFE), vinyl fluoride (VF), and fluorovinyl ether.

The reactive functional group-containing fluoropolymer may, for example, be a TFE/non-fluorinated olefin/hydroxybutyl vinyl ether copolymer, a TFE/vinyl carboxylate/hydroxybutyl vinyl ether copolymer, or a TFE/alkyl vinyl ether/hydroxybutyl vinyl ether copolymer.

More specifically, the reactive functional group-containing fluoropolymer may be a TFE/isobutylene/hydroxybutyl vinyl ether copolymer, a TFE/vinyl versatate/hydroxybutyl vinyl ether copolymer, or a TFE/VdF/hydroxybutyl vinyl ether copolymer. The reactive functional group-containing fluoropolymer may particularly preferably be a TFE/isobutylene/hydroxybutyl vinyl ether copolymer or a TFE/vinyl versatate/hydroxybutyl vinyl ether copolymer.

As the reactive functional group-containing fluoropolymer, for example, a product in a Zeffle GK series may be used.

The curing agent contained in the fluororesin composition may appropriately be selected by a person skilled in the art depending on the type of a reactive functional group contained in the reactive functional group-containing fluoropolymer.

When the reactive functional group is a hydroxy group, the curing agent may preferably be a single agent or a combination of two or more agents selected from isocyanate curing agents, melamine resins, silicate compounds, and isocyanate group-containing silane compounds.

When the reactive functional group is a carboxyl group, the curing agent may preferably be a single agent or a combination of two or more agents selected from amino curing agents and epoxy curing agents.

When the reactive functional group is an amino group, the curing agent may be a single agent or a combination of two or more agents selected from carbonyl group-containing curing agents, epoxy curing agents, and acid anhydride curing agents.

The content of the curing agent in the fluororesin composition may, for example, be 15 parts by mass to 50 parts by mass, preferably 20 parts by mass to 40 parts by mass, and more preferably 23 parts by mass to 35 parts by mass relative to 100 parts by mass of the reactive functional group-containing fluoropolymer. These numerical ranges apply also to the content of the curing agent in a cured product of the fluororesin composition.

The content of the curing agent may be determined by pyrolysis gas chromatography (Py-GC/MS).

In an embodiment of the present invention, the reactive functional group contained in the reactive functional group-containing fluoropolymer may be a hydroxy group, and the curing agent may be an isocyanate curing agent. In the embodiment, the isocyanate curing agent is preferably a hexamethylene diisocyanate (HDI) polyisocyanate.

The content of the HDI polyisocyanate in the fluororesin composition may, for example, be 15 parts by mass to 50 parts by mass, preferably 20 parts by mass to 40 parts by mass, and more preferably 23 parts by mass to 35 parts by mass relative to 100 parts by mass of the reactive functional group-containing fluoropolymer. These numerical ranges apply also to the content of the HDI polyisocyanate in a cured product of the fluorine resin composition.

As the HDI polyisocyanate, for example, a single polyisocyanate or a combination of two or more polyisocyanates selected from isocyanurate-type polyisocyanates, adduct-type polyisocyanates, and biuret-type polyisocyanates may be used. In the present invention, the isocyanate curing agent may preferably be an isocyanurate-type polyisocyanate and/or an adduct-type polyisocyanate and more preferably a combination of an isocyanurate-type polyisocyanate and an adduct-type polyisocyanate.

When a combination of an isocyanurate-type polyisocyanate and an adduct-type polyisocyanate is used as the curing agent, the mass ratio thereof is, for example, 10:6 to 10:10 and preferably 10:7 to 10:9. The total amount thereof may, for example, be 15 parts by mass to 50 parts by mass, preferably 20 parts by mass to 40 parts by mass, and more preferably 25 parts by mass to 35 parts by mass relative to 100 parts by mass of the reactive functional group-containing fluoropolymer.

The content ratio of these curing agents may be determined by pyrolysis gas chromatography (Py-GC/MS).

The fluororesin that forms the surface layers contains particles preferably having an average particle size of 1 µm to 10 µm, more preferably 2 µm to 9 µm, as determined by laser diffraction particle size analysis. The average particle size is a volume average diameter weighted by volume and is determined in accordance with JIS Z8825. The average particle size may be determined, for example, with a particle size analyser (SALD-2200, Shimadzu Corporation). The particles can improve mold release properties of the release film.

The particles are preferably inorganic particles or organic particles. Examples of the inorganic particles include particles of silicon dioxide (particularly amorphous silicon dioxide), calcium carbonate, magnesium carbonate, calcium phosphate, kaolin, talc, aluminum oxide, titanium oxide, alumina, barium sulfate, calcium fluoride, lithium fluoride, zeolite, and molybdenum sulfide. Examples of the organic particles include cross-linked polymer particles and calcium oxalate particles. In the present invention, the particles are preferably inorganic particles, more preferably silicon dioxide particles, and even more preferably amorphous silicon dioxide particles. The amorphous silicon dioxide may be a sol-gel type silica. As the amorphous silicon dioxide, for example, an amorphous silicon dioxide in a Sylysia series may be used.

The content of the particles in the fluororesin composition may, for example, be 10 parts by mass to 30 parts by mass, preferably 12 parts by mass to 25 parts by mass, and more preferably 15 parts by mass to 20 parts by mass relative to 100 parts by mass of the reactive functional group-containing fluoropolymer. These numerical ranges apply also to the content of the particles in a cured product of the fluorine resin composition.

The content of the particles may be determined by thermogravimetric analysis (TGA).

The fluororesin composition may contain a solvent. The solvent type may appropriately be selected by a person skilled in the art. Examples of the solvent include butyl acetate, ethyl acetate, and methyl ethyl ketone (also referred to as MEK). For example, a mixture of these three solvents may be used as the solvent.

The fluororesin composition may contain a release accelerator. Examples of the release accelerator include an amino modified-methylpolysiloxane, an epoxy modified-methylpolysiloxane, a carboxy modified-methylpolysiloxane, and a carbinol modified-methylpolysiloxane. Preferably, the release accelerator is an amino modified-methylpolysiloxane.

The content of the release accelerator may, for example, be 0.01 part by mass to 3 parts by mass, preferably 0.05 part by mass to 2 parts by mass, and more preferably 0.1 part by mass to 1 part by mass relative to 100 parts by mass of the reactive functional group-containing fluoropolymer. These numerical ranges apply also to the content of the release accelerator in a cured product of the fluorine resin composition.

The thickness of the surface layer may, for example, be 1 µm to 10 µm, preferably 2 to 9 µm, and more preferably 3 µm to 8 µm.

The fluororesin composition may be produced by mixing and stirring the above-described components by means known by a person skilled in the art. For the mixing and stirring, for example, a mixer such as a high-speed mixer, a homomixer, and a paint shaker may be used. For the mixing and stirring, for example, a dissolver such as an edge-turbine high-speed dissolver may also be used.

A cured product of the fluororesin composition may be obtained as follows: the fluororesin composition is applied onto the surface of the base layer, and is heated, for example, at 100° C. to 200° C., preferably at 120° C. to 180° C., for example, for 10 seconds to 240 seconds, preferably for 30 seconds to 120 seconds. The cured product forms the surface layer. The application amount of the fluororesin composition may appropriately be set by a person skilled in the art depending on the thickness of a surface layer to be formed.

One surface layer of the two surface layers comes into contact with a mold in production of a molded article, and the other surface layer comes into contact with a molded article in production of the molded article. In the present description, a surface layer to come into contact with a mold is referred to as a mold-side surface layer, and a surface layer to come into contact with a molded article is referred to as a molded article-side surface layer. The composition of the mold-side surface layer may be the same as or different from the composition of the molded article-side surface layer.

The release accelerator is preferably contained in the fluororesin of the molded article-side surface layer. The release accelerator may be contained in the fluororesins of both the mold-side surface layer and the molded article-side surface layer.

In a preferred embodiment of the present technique, the mold-side surface layer comprises a cured product of a fluororesin composition containing the reactive functional group-containing fluoropolymer, the curing agent, and the particles, and the molded article-side surface layer comprises a cured product of a fluororesin composition containing the reactive functional group-containing fluoropolymer (particularly the hydroxy group-containing tetrafluoroethylene polymer), the curing agent, the particles, and the release accelerator.

More preferably, the mold-side surface layer comprises a cured product of a fluororesin composition containing a hydroxy group-containing tetrafluoroethylene polymer, an HDI polyisocyanate, and silicon dioxide particles, and the molded article-side surface layer comprises a cured product of a fluororesin composition containing a hydroxy group-containing tetrafluoroethylene polymer, an HDI polyisocyanate, silicon dioxide particles, and an amino modified-methylpolysiloxane.

Such two surface layers particularly contribute to making the release film of the present invention have excellent mold release properties.

[Features of Release Film]

According to a preferred embodiment of the present invention, the tensile breaking strength of the release film of the present invention may be 40 MPa to 200 MPa, more preferably 40 MPa to 120 MPa, even more preferably 40 MPa to 110 MPa, and particularly preferably 45 MPa to 100 MPa, as determined at 175° C. in accordance with JIS K7127, and the tensile elongation at break of the release film may be 200% to 500%, more preferably 250% to 450%, and even more preferably 300% to 400%, as determined at 175° C. in accordance with JIS K7127.

A tensile breaking strength and a tensile elongation at break each within the above numerical ranges contribute to making it possible to use the release film of the present invention in molding multiple times.

The gas ($O_2$) permeability of the release film of the present invention may, for example, be 5,000 to 50,000 cc/m²·24 hr·atm, particularly 5,000 to 30,000 cc/m²·24 hr·atm, and more particularly 5,000 to 20,000 cc/m²·24 hr·atm or less, as determined at 175° C. in accordance with JIS K7126-1. The release film of the present invention has such a low gas permeability. Hence, when molding is performed with the release film of the present invention, mold contamination by gas generated from a resin can be suppressed.

The thickness of the release film of the present invention may, for example, be 30 μm to 100 μm, preferably 35 μm to 90 μm, and more preferably 40 to 80 μm. A thickness within the above numerical range makes the release film easily deformable along the shape of a mold.

[Applications of Release Film]

The release film of the present invention may be used, for example, in various molding processes and is particularly suitable for use in transfer molding or compression molding. The release film of the present invention may be used, for example, in transfer molding or compression molding, while placed between a mold and a resin. The molding temperature during molding where the release film of the present invention is used may, for example, be 100° C. to 250° C. and preferably 120° C. to 200° C.

Figure 2:
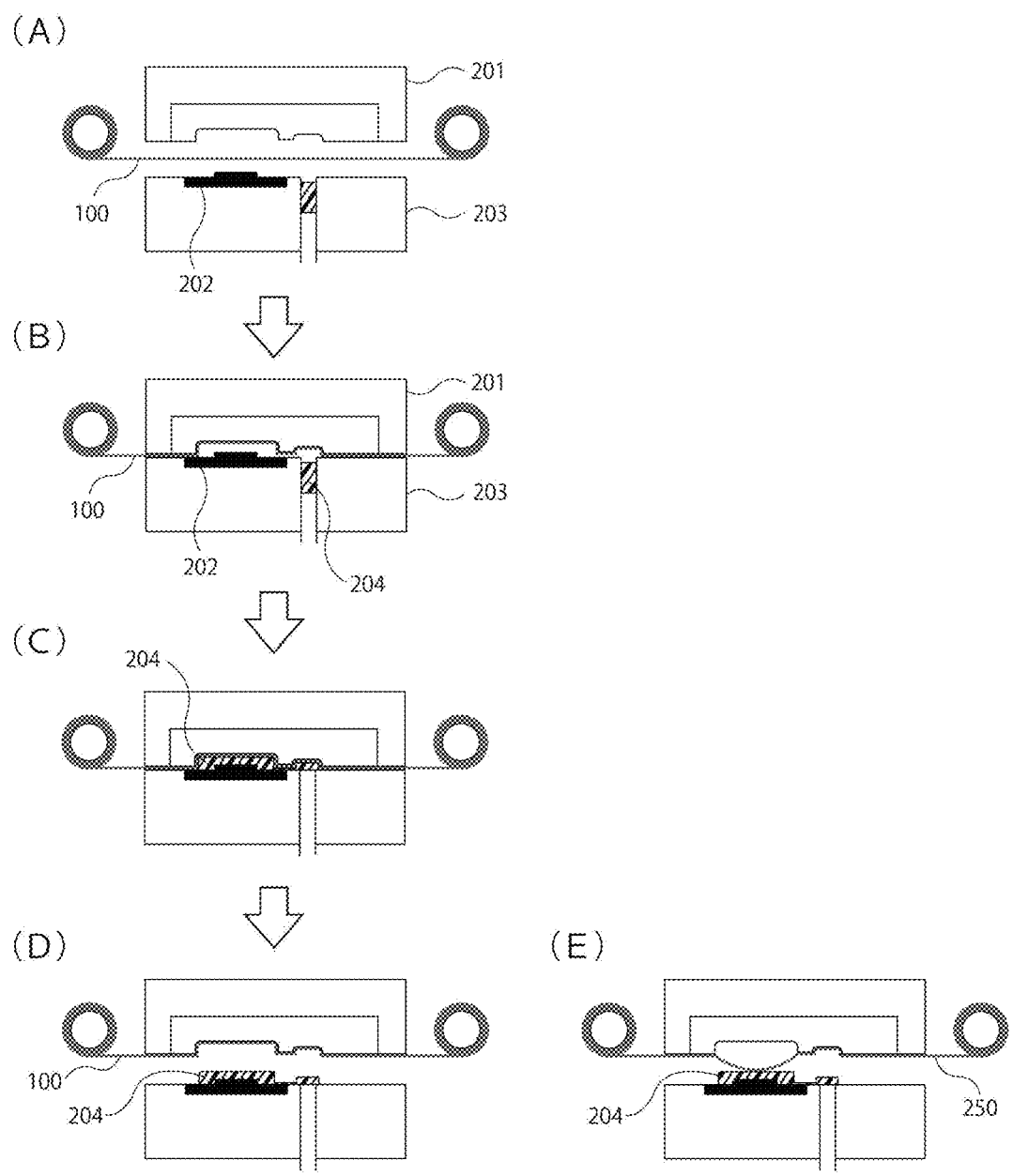
FIG. 2 are views showing an example usage of a release film of the present invention in transfer molding.

An example usage of the release film of the present invention in transfer molding will be described with reference to FIG. 2. As shown in FIG. 2A, a release film 100 of the present invention is placed between an upper mold 201 and a lower mold 203 with a semiconductor device-loaded substrate 202. Next, as shown in FIG. 2B, while the release film 100 is attached onto the inner face of the mold 201, the upper mold 201 is brought into contact with the substrate 202 and the lower mold 203. Next, as shown in FIG. 2C, a resin 204 is introduced between the upper mold 201 and the substrate 202, and then the resin 204 is cured. After curing, as shown in FIG. 2D, the upper mold 201 is removed from the substrate 202. The release film of the present invention has excellent mold release properties, and this allows the cured resin 204 to be smoothly released from the upper mold 201 in the step of FIG. 2D. If having insufficient mold release properties, a release film 250 might adhere to a cured resin 204, for example, as shown in FIG. 2E.

Figure 3:
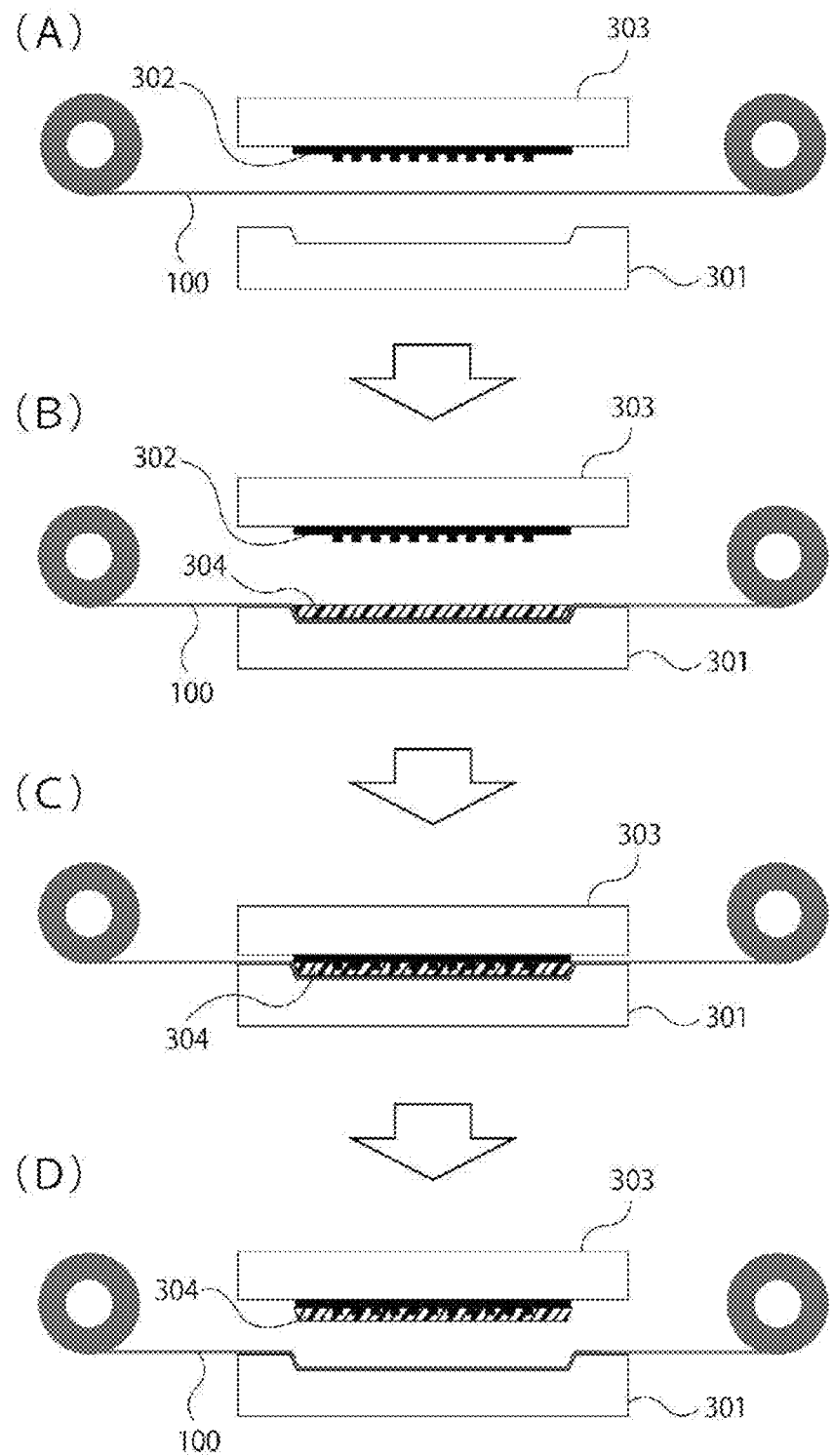
FIG. 3 are views showing an example usage of a release film of the present invention in compression molding.

An example usage of the release film of the present invention in compression molding will be described with reference to FIG. 3. As shown in FIG. 3A, a release film 100 of the present invention is placed between a lower mold 301 and an upper mold 303 with a semiconductor device-loaded substrate 302. Next, as shown in FIG. 3B, while the release film 100 is attached to the inner face of the lower mold 301, a resin 304 is placed in a hollow of the lower mold 301. As shown in FIG. 3C, the upper mold 303 is moved to be brought into contact with the lower mold 301. Then, the resin 304 is cured. After curing, as shown in FIG. 3D, the upper mold 303 is removed from the lower mold 301. The release film of the present invention has excellent mold release properties, and this allows the cured resin 304 to be smoothly released from the lower mold 301 in the step of FIG. 3D.

The release film of the present invention may be used for molding of various resins, and may be used, for example, for molding of an epoxy resin or a silicone resin. The type of a resin for forming a molded article may appropriately be selected by a person skilled in the art.

The release film of the present invention may be used for molding, for example, two or more times, preferably four or more times, more preferably five or more times, more preferably six or more times, and even more preferably eight or more times. The release film of the present invention may be used for molding, for example, 2 to 20 times, preferably 4 to 15 times, more preferably 5 to 15 times, more preferably 6 to 15 times, and even more preferably 8 to 12 times. Through multiple release operations, the release film of the present invention maintains its performance and is unlikely to break. Hence, the release film of the present invention can be used in multiple molding processes. This can reduce molding costs.

[Method of Manufacturing Release Film]

The present invention provides a method of manufacturing the release film described above. The manufacturing method comprises an applying step of applying a fluororesin composition onto two faces of a base layer comprising an easily moldable polyethylene terephthalate resin and a curing step of, after the applying step, curing the fluororesin composition.

The above explanation applies also to the base layer and the fluororesin composition used in the applying step, and the explanation thereof is omitted.

The applying step may appropriately be carried out by a person skilled in the art so as to achieve intended layer thicknesses. For example, the fluororesin composition may be applied onto two faces of the base layer by gravure rolling, reverse rolling, offset gravure coating, kiss coating, reverse kiss coating, wire bar coating, spray coating, or impregnation coating. An apparatus for coating by such a method may appropriately be selected by a person skilled in the art.

The curing step comprises heating the fluororesin composition, for example, at 100° C. to 200° C., preferably at 120° C. to 180° C., for example, for 10 seconds to 240 seconds, preferably for 30 seconds to 120 seconds. By the heating, the fluororesin composition is cured.

The present invention will next be described in more detail with reference to examples. The examples described below are merely typical examples of the present invention, and the scope of the invention is not intended to be limited to these examples.

Example 1

As a base layer, a film formed of an easily moldable polyethylene terephthalate resin (Teleflex FT, Teijin Ltd., a thickness of 50 μm, a glass transition temperature of 90° C.) was prepared. Next, two fluororesin compositions (hereinafter referred to as first fluororesin composition and second fluororesin composition) to be applied onto the film were prepared.

The first fluororesin composition was prepared by mixing and stirring 100 parts by mass of a hydroxy group-containing tetrafluoroethylene resin composition (Zeffle GK570, Daikin Industries, Ltd., containing 65% by mass of a hydroxy group-containing tetrafluoroethylene resin), 11.47 parts by mass of an amorphous silicon dioxide (Sylysia 380, Fuji Silysia Chemical Ltd.), 10 parts by mass of an isocyanurate-type polyisocyanate (a curing agent, Sumidur N3300, Sumitomo Bayer Urethane Co., Ltd.), 7.79 parts by mass of an adduct-type polyisocyanate (a curing agent, Duranate AE700-100), 6.18 parts by mass of butyl acetate, 44.62 parts by mass of ethyl acetate, and 89.25 parts by mass of MEK. The amorphous silicon dioxide had an average particle size (volume average diameter as described above) of 8.8 μm as determined with a particle size analyser (SALD-2200, Shimadzu Corporation) by laser diffraction particle size analysis.

The second fluororesin composition was the same as the first fluororesin composition except that 0.31 part by mass of an amino modified-methylpolysiloxane (a release accelerator, Shin-Etsu Chemical) was further added to the first fluororesin composition.

Onto one face of the film, the first fluororesin composition was applied, and onto the other face of the film, the second fluororesin composition was applied. The application was performed with a reverse kiss coating apparatus. After the application, these compositions were cured by heating at 150° C. for 60 seconds, giving a release film in which fluororesin layers were laminated on the corresponding faces of the easily moldable PET resin film (hereinafter referred to as "release film of Example 1").

The release film of Example 1 had a thickness of 70±5 μm. The base layer in the release film of Example 1 had a thickness of 50 μm±10%. Of the two surface layers in the release film of Example 1, the surface layer of a cured product of the first fluororesin composition had a thickness of 5.5±0.5 μm. The surface layer of a cured product of the second fluororesin composition had a thickness of 5.5±0.5 μm.

The cured product of the first fluororesin composition contained 17.65 parts by mass of the amorphous silicon dioxide, 15.39 parts by mass of the isocyanurate-type polyisocyanate, and 11.98 parts by mass of the adduct-type polyisocyanate relative to 100 parts by mass of the hydroxy group-containing tetrafluoroethylene resin.

The cured product of the second fluororesin composition contained 17.65 parts by mass of the amorphous silicon dioxide, 15.39 parts by mass of the isocyanurate-type polyisocyanate, 11.98 parts by mass of the adduct-type polyisocyanate, and 0.48 part by mass of the amino modified-methylpolysiloxane relative to 100 parts by mass of the hydroxy group-containing tetrafluoroethylene resin.

The release film of Example 1 had a tensile breaking strength of 50 MPa as determined at 175° C. in accordance with JIS K7127. The release film had a tensile elongation at break of 350% as determined at 175° C. in accordance with JIS K7127.

Example 2

As a base layer, a film formed of an easily moldable polyethylene terephthalate resin (EMBLET CTK-38, Unitika Ltd., a thickness of 38 μm, a glass transition temperature of 65° C.) was prepared.

Onto one face of the film, the first fluororesin composition according to Example 1 was applied, and onto the other face of the film, the second fluororesin composition according to Example 1 was applied. After the application, these compositions were cured by heating at 150° C. for 60 seconds, giving a release film in which fluororesin layers were laminated on the corresponding faces of the easily moldable PET resin film (hereinafter referred to as "release film of Example 2").

The release film of Example 2 had a thickness of 60±5 μm. The base layer in the release film of Example 2 had a thickness of 38 μm±10%. Of the two surface layers in the release film of Example 2, the surface layer of a cured product of the first fluororesin composition had a thickness of 5.5±0.5 μm. The surface layer of a cured product of the second fluororesin composition had a thickness of 5.5±0.5 μm.

The cured product of the first fluororesin composition contained 17.65 parts by mass of the amorphous silicon dioxide, 15.39 parts by mass of the isocyanurate-type polyisocyanate, and 11.98 parts by mass of the adduct-type polyisocyanate relative to 100 parts by mass of the hydroxy group-containing tetrafluoroethylene resin.

The cured product of the second fluororesin composition contained 17.65 parts by mass of the amorphous silicon dioxide, 15.39 parts by mass of the isocyanurate-type polyisocyanate, 11.98 parts by mass of the adduct-type polyisocyanate, and 0.48 part by mass of the amino modified-methylpolysiloxane relative to 100 parts by mass of the hydroxy group-containing tetrafluoroethylene resin.

The release film of Example 2 had a tensile breaking strength of 90 MPa as determined at 175° C. in accordance with JIS K7127. The release film had a tensile elongation at break of 350% as determined at 175° C. in accordance with JIS K7127.

Example 3

As a base layer, a film formed of an easily moldable polyethylene terephthalate resin (Teleflex FT3, Teijin Ltd., a thickness of 25 μm, a glass transition temperature of 70° C.) was prepared.

Onto one face of the film, the first fluororesin composition according to Example 1 was applied, and onto the other face of the film, the second fluororesin composition according to Example 1 was applied. After the application, these compositions were cured by heating at 150° C. for 60 seconds, giving a release film in which fluororesin layers were laminated on the corresponding faces of the easily moldable PET resin film (hereinafter referred to as "release film of Example 3").

The release film of Example 3 had a thickness of 49±5 μm. The base layer in the release film of Example 3 had a thickness of 25 μm±10%. Of the two surface layers in the release film of Example 3, the surface layer of a cured product of the first fluororesin composition had a thickness of 5.5±0.5 μm. The surface layer of a cured product of the second fluororesin composition had a thickness of 5.5±0.5 μm.

The cured product of the first fluororesin composition contained 17.65 parts by mass of the amorphous silicon dioxide, 15.39 parts by mass of the isocyanurate-type polyisocyanate, and 11.98 parts by mass of the adduct-type polyisocyanate relative to 100 parts by mass of the hydroxy group-containing tetrafluoroethylene resin.

The cured product of the second fluororesin composition contained 17.65 parts by mass of the amorphous silicon dioxide, 15.39 parts by mass of the isocyanurate-type polyisocyanate, 11.98 parts by mass of the adduct-type polyisocyanate, and 0.48 part by mass of the amino modified-methylpolysiloxane relative to 100 parts by mass of the hydroxy group-containing tetrafluoroethylene resin.

The release film of Example 3 had a tensile breaking strength of 40 MPa as determined at 175° C. in accordance with JIS K7127. The release film had a tensile elongation at break of 550% as determined at 175° C. in accordance with JIS K7127.

Comparative Example 1

As a base layer, a film formed of a conventional polyethylene terephthalate resin (Tetoron G2CW, Teijin Ltd., a thickness of 38 μm, a glass transition temperature of 100° C.) was prepared.

Onto one face of the film, the first fluororesin composition according to Example 1 was applied, and onto the other face of the film, the second fluororesin composition according to Example 1 was applied. After the application, these compositions were cured by heating at 150° C. for 60 seconds, giving a release film in which fluororesin layers were laminated on the corresponding faces of the easily moldable PET resin film (hereinafter referred to as "release film of Comparative Example 1").

The release film of Comparative Example 1 had a thickness of 60±5 μm. The base layer in the release film of Comparative Example 1 had a thickness of 38 μm±10%. Of the two surface layers in the release film of Comparative Example 1, the surface layer of a cured product of the first fluororesin composition had a thickness of 5.5±0.5 μm. The surface layer of a cured product of the second fluororesin composition had a thickness of 5.5±0.5 μm.

The cured product of the first fluororesin composition contained 17.65 parts by mass of the amorphous silicon dioxide, 15.39 parts by mass of the isocyanurate-type polyisocyanate, and 11.98 parts by mass of the adduct-type polyisocyanate relative to 100 parts by mass of the hydroxy group-containing tetrafluoroethylene resin.

The cured product of the second fluororesin composition contained 17.65 parts by mass of the amorphous silicon dioxide, 15.39 parts by mass of the isocyanurate-type polyisocyanate, 11.98 parts by mass of the adduct-type polyisocyanate, and 0.48 part by mass of the amino modified-methylpolysiloxane relative to 100 parts by mass of the hydroxy group-containing tetrafluoroethylene resin.

The release film of Comparative Example 1 had a tensile breaking strength of 140 MPa as determined at 175° C. in accordance with JIS K7127. The release film had a tensile elongation at break of 350% as determined at 175° C. in accordance with JIS K7127.

(Mold Contamination by Release Film)

The release film of Comparative Example 1 was used to perform molding of an epoxy resin by transfer molding. The molding was performed as shown in FIG. 2. The molding was performed such that the layer of the cured product of the first fluororesin composition was brought into contact with a mold, and the layer of the cured product of the second fluororesin composition was brought into contact with the epoxy resin. Next, the release film used in the above molding was used to perform the same molding once again. The same release film was used for the same molding twice more, and the molding was performed four times in total with the single release film.

Figure 4:
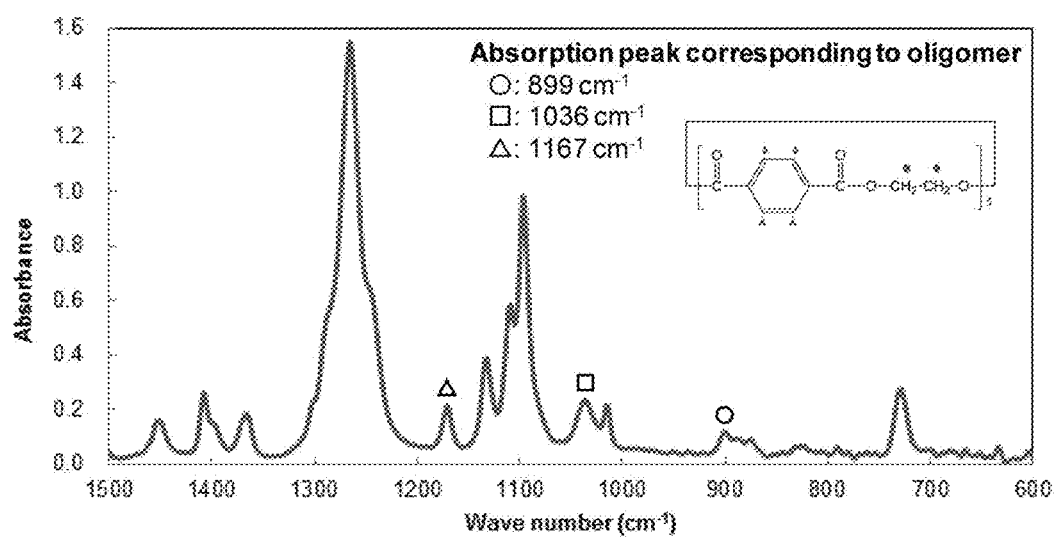
FIG. 4 is a view showing an FT-IR spectrum.

After the fourth molding, white substance adhesion was observed on the mold. The white substance was analyzed with a Fourier transformation infrared spectrometer (IRT-5000 FT-IR microspectrometer, JASCO Corporation). As a result, an FT-IR spectrum as shown in FIG. 4 was obtained. The FT-IR spectrum revealed that the white substance was an oligomer of ethylene terephthalate (mainly a cyclic trimer). In other words, it was revealed that an oligomer contained in the base layer formed of the PET resin passed through the surface layer of the cured product of the fluororesin composition and contaminated the mold. It was also revealed that the cured product was insufficient to prevent the oligomer from moving to a mold and a molded article.

Figure 5:
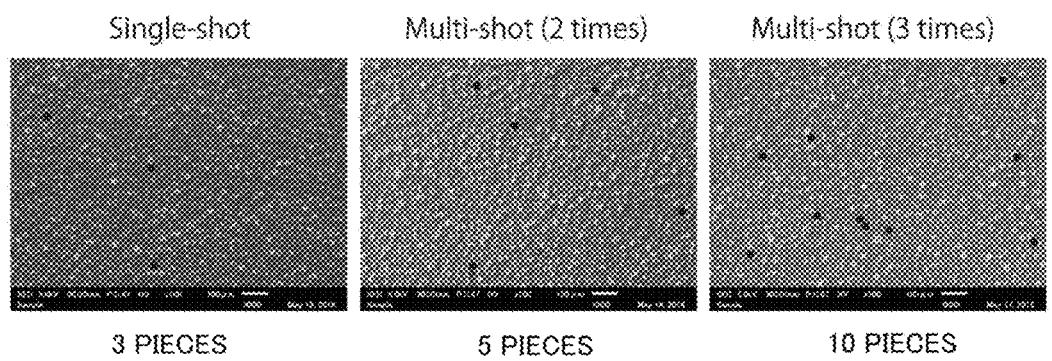
FIG. 5 are each an electron micrograph of a mold-side surface of a release film after molding.

Of the molding four times, after the first, the second, and the third molding, the mold-side surface of the release film was observed under a scanning electron microscope (JSM-IT100 SEM, JEOL Ltd.). The observation results are shown in FIG. 5. FIG. 5 are each an electron micrograph of a 1.2 mm×0.8 mm region in the release film. As shown in the left micrograph in FIG. 5, the oligomer was precipitated at three sites after the first molding. As shown in the center micrograph in FIG. 5, the oligomer was precipitated at five sites after the second molding, and as shown in the right micrograph in FIG. 5, the oligomer was precipitated at ten sites after the third molding. Hence, it has been revealed that as the number of molding times increases, a larger amount of the cyclic trimer moves to a mold and a molded article.

Figure 6:
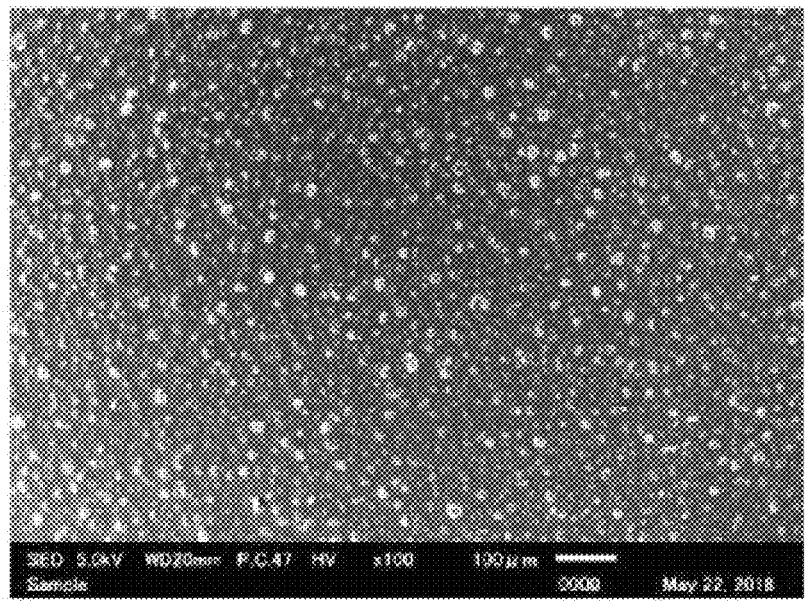
FIG. 6 is an electron micrograph of a mold-side surface of a release film after molding.

The release film of Example 1 was used to perform molding of an epoxy resin four times by transfer molding in the same manner as that in Comparative Example 1. After the fourth molding, the mold-side surface of the release film was observed under a scanning electron microscope (JSM-IT100 SEM, JEOL Ltd.). The observation result is shown in FIG. 6. FIG. 6 is an electron micrograph of a 1.2 mm×0.8 mm region in the release film. As shown in FIG. 6, no oligomer precipitation was observed even after the fourth molding. Hence, by using the film formed of an easily moldable PET resin as the base layer, the oligomer can be prevented from moving to a mold and a molded article.

The release films of Examples 2 and 3 were also used to perform molding of an epoxy resin four times by transfer molding in the same manner as that in Comparative Example 1. As a result, in each case of the release films of Examples 2 and 3, no oligomer precipitation was observed as with the release film of Example 1.

Figure 7:
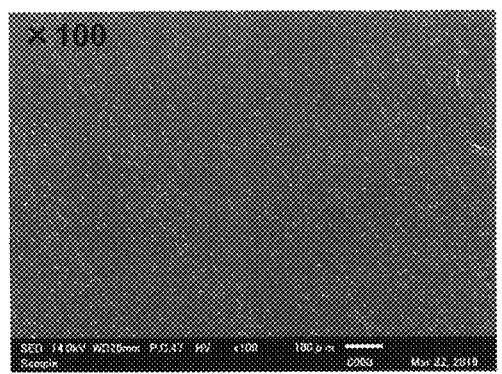
FIG. 7 are each a micrograph of a surface of a release film after heating.
Figure 7:
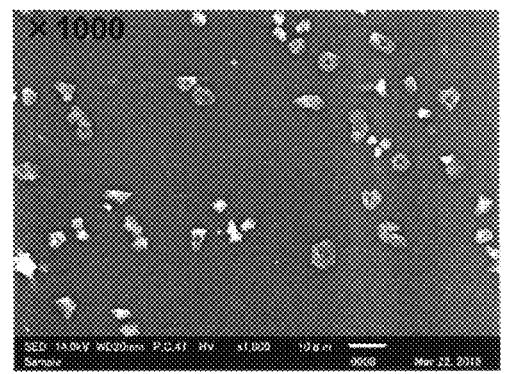
Figure 8:
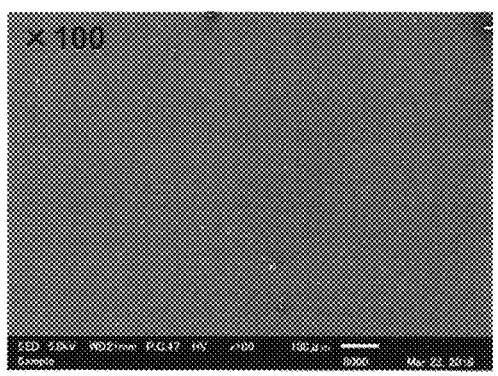
FIG. 8 are each a micrograph of a surface of a release film after heating.
Figure 8:
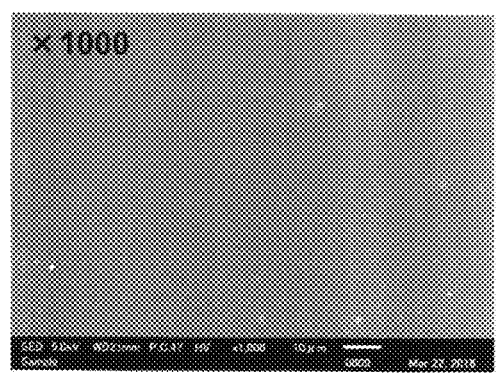

Whether oligomer precipitation was observed or not was examined when only the release film of Example 1 or Comparative Example 1 was heated. For the examination, the release film of Example 1 or Comparative Example 1 was interposed between SUS (Steel Use Stainless) plates and was heated on a hot plate at 175° C. for 30 minutes. Each surface of the release films of Example 1 and Comparative Example 1 after heating was observed under a microscope. Micrographs of Comparative Example 1 are shown in FIG. 7. The left micrograph in FIG. 7 was at a 100-fold magnification, and the right micrograph in FIG. 7 was at a 1,000-fold magnification. These micrographs revealed that the oligomer was precipitated after heating. Micrographs of Example 1 are shown in FIG. 8. The left micrograph in FIG. 8 was at a 100-fold magnification, and the right micrograph in FIG. 8 was at a 1,000-fold magnification. These micrographs revealed that no oligomer precipitation was observed after heating the release film of Example 1.

The results of oligomer precipitation and the glass transition temperatures of the base layers included in the release films of Examples 1 to 3 and Comparative Example 1 may suggest that oligomer precipitation can be prevented when a PET resin of the base layer has a glass transition temperature within a particular numerical range (for example, 60° C. to 95° C.).

The molded article of an epoxy resin was smoothly released from each release film of Examples 1 to 3 after each of the first molding to the fourth molding. This has revealed that the release films of Examples 1 to 3 have excellent mold release properties and that the mold release properties are maintained through multiple molding operations.

(Suitability of Release Film for Multi-Shot Molding)

As described in the above "Mold contamination by release film", the release films of Examples 1 to 3 were able to be used in continuous molding at least four times.

The molding described in the above "Mold contamination by release film" was further performed multiple times, and the release films of Examples 1 and 2 were broken in the tenth molding. The release film of Example 3 was broken in the fifth molding. Accordingly, the release films of Examples 1 and 2 can be used for molding more times than the release film of Example 3. In other words, the release films of Examples 1 and 2 have higher suitability for multi-shot molding than the release film of Example 3.

The tensile breaking strength and the tensile elongation at break of the release film of Example 1 were 50 MPa and 350%, respectively, as described above. The tensile breaking strength and the tensile elongation at break of the release film of Example 2 were 90 MPa and 350%, respectively, as described above.

Meanwhile, the tensile breaking strength and the tensile elongation at break of the release film of Example 3 were 40 MPa and 550%, respectively, as described above.

a result, the first release film was broken in the third molding. The second release film was broken in the second molding.

The results of the suitability for multi-shot molding of the release films of Examples 1 to 3 and Comparative Example 1 and the commercially available release films (hereinafter referred to as commercially available release films 1 and 2) as well as the tensile breaking strength and the tensile elongation at break of these films reveal that a release film having a tensile breaking strength and a tensile elongation at break each within a particular numerical range (for example, 40 MPa to 200 MPa and 200% to 500%) can be used for molding more times.

For easy comparison of the above results of the release films of Examples 1 to 3 and Comparative Example 1 and the commercially available release films 1 and 2, these results are shown in Table 1.

In Table 1, the evaluation criteria for suitability for multi-shot molding are as follows:
- AA: A film was not broken after molding five or more times.
- A: A film was not broken after molding three or more times.
- B: A film was broken in the third molding.
- C: A film was broken in the second molding.

TABLE 1

|  | example1 | example2 | example3 | new comparative example 1 |
| --- | --- | --- | --- | --- |
| PET resin of base layer | easily moldable PET | easily moldable PET | easily moldable PET | easily moldable PET |
| Glass transition temperature of PET resin (° C.) | 90 | 65 | 70 | 90 |
| isocyanate curing agent | combination | combination | combination | isocyanurate-type polyisocyanates only |
| Tensile breaking strength (MPa) | 50 | 90 | 40 | 30 |
| Tensile elongation at break (%) | 350 | 350 | 550 | 150 |
| Oligomer precipitation | not observed | not observed | not observed | not observed |
| Suitability for multi-shot molding | AA | AA | A | C |

The above results of the suitability for multi-shot molding as well as the tensile breaking strength and the tensile elongation at break reveal that by adjusting the tensile breaking strength and the tensile elongation at break of a release film, the resulting release film can be used for molding more times.

The tensile breaking strength and the tensile elongation at break of the release film of Comparative Example 1 were 140 MPa and 350%, respectively, as described above. The release film of Comparative Example 1 was further used to perform molding multiple times and was broken in the tenth molding.

Two commercially available release films were prepared. The tensile breaking strength and the tensile elongation at break of the first release film were 7 MPa and 550%, respectively, as determined by the above measurement method. The tensile breaking strength and the tensile elongation at break of the second release film were 26 MPa and 130%, respectively, as determined by the above measurement method. These two release films were used to perform molding multiple times in the same manner as the above. As

|  | Commercially available release film 1 | Commercially available release film 2 |
| --- | --- | --- |
| Tensile breaking strength (MPa) | 7 | 26 |
| Tensile elongation at break (%) | 550 | 130 |
| Suitability for multi-shot molding | B | C |

(Gas Permeability)

The oxygen gas permeability of the release film of Example 1 was determined at 175° C. in accordance with JIS K7126-1. The result was 10,000 cc/m$^2$·24 hr·atm. The oxygen gas permeabilities of the commercially available release films 1 and 2 were also determined by substantially the same method. As a result, the oxygen gas permeabilities of the commercially available release films 1 and 2 were 142,000 and 130,000 cc/m$^2$·24 hr·atm, respectively. This reveals that the release film of Example 1 also has excellent oxygen gas permeability.

REFERENCE SIGNS LIST 100 release film
101 base layer
102 surface layer
103 surface layer

The invention claimed is:

1. A release film comprising:
a base layer formed of an easily moldable polyethylene terephthalate resin; and
surface layers laminated on two faces of the base layer and formed of a fluororesin;
wherein the easily moldable polyethylene terephthalate resin has a glass transition temperature of 60° C. to 95° C.,
the fluororesin that forms the surface layer comprises a tetrafluoroethylene resin, and the fluororesin that forms the surface layer on at least one face of the base layer comprises particles having an average particle size of 1 μm to 10 μm determined by laser diffraction particle size analysis, and contains a combination of isocyanate-type polyisocyanate and an adduct-type polyisocyanate.

2. The release film according to claim 1, wherein the content of a tetrafluoroethylene resin in the fluororesin is 70% by mass or more relative to the total mass of the fluororesin.

3. The release film according to claim 1, wherein
the release film has a tensile breaking strength of 40 MPa to 200 MPa as determined at 175° C. in accordance with JIS K7127, and
the release film has a tensile elongation at break of 200% to 500% as determined at 175° C. in accordance with JIS K7127.

4. The release film according to claim 1, wherein the release film has an oxygen gas permeability of 5,000 to 50,000 cc/m$^2$·24 hr·atm as determined at 175° C. in accordance with JIS K7126-1.

5. The release film according to claim 1, wherein the base layer has a tensile breaking strength of 40 MPa to 200 MPa as determined at 175° C. in accordance with JIS K7127.

6. The release film according to claim 1, wherein the base layer has a tensile elongation at break of 200% to 500% as determined at 175° C. in accordance with JIS K7127.

7. The release film according to claim 1, wherein the fluororesin that forms the surface layer on at least one face of the base layer comprises an isocyanate curing agent.

8. The release film according to claim 1, wherein the particles are inorganic particles or organic particles.

9. The release film according to claim 1, wherein the thickness of the surface layer is 1 μm to 10 μm.

10. The release film according to claim 1, used for transfer molding or compression molding.

11. The release film according to claim 1, used for molding two or more times.

* * * * *